US011936370B2

(12) United States Patent
Yoshino et al.

(10) Patent No.: US 11,936,370 B2
(45) Date of Patent: Mar. 19, 2024

(54) PROTECTION DEVICE, LOAD DRIVE SYSTEM, PROTECTION METHOD, AND RECORDING MEDIUM

(71) Applicant: MITSUBISHI HEAVY INDUSTRIES, LTD., Tokyo (JP)

(72) Inventors: Yusuke Yoshino, Tokyo (JP); Takashi Nakagami, Tokyo (JP); Ryo Iida, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 20 days.

(21) Appl. No.: 17/742,736

(22) Filed: May 12, 2022

(65) Prior Publication Data

US 2022/0368323 A1 Nov. 17, 2022

(30) Foreign Application Priority Data

May 14, 2021 (JP) ................................ 2021-082626

(51) Int. Cl.
*H03K 17/082* (2006.01)
*H02H 1/00* (2006.01)

(52) U.S. Cl.
CPC ....... *H03K 17/0822* (2013.01); *H02H 1/0007* (2013.01)

(58) Field of Classification Search
CPC ........... H02H 5/04; H02H 5/041; H02H 3/20; H02H 3/202; H02H 7/1227; H02H 7/1257; H03K 17/0822; H03K 17/04; H03K 2217/0081
USPC .............................. 361/93.7–93.9, 103, 104
See application file for complete search history.

(56) References Cited

U.S. PATENT DOCUMENTS 6,137,668 A * 10/2000 Feldtkeller ......... H03K 17/0822 361/103
2007/0008749 A1* 1/2007 Baurle ............. H02M 3/33507 363/21.12

FOREIGN PATENT DOCUMENTS

JP 2018-198460 12/2018

* cited by examiner

*Primary Examiner* — Danny Nguyen
(74) *Attorney, Agent, or Firm* — WENDEROTH, LIND & PONACK, L.L.P.

(57) ABSTRACT

A protection device is capable of protecting a load drive system at an appropriate timing according to a temperature of a power semiconductor. The protection device includes: a capacitor configured to output a voltage according to a charge accumulated by a first current; and a protection circuit configured to: (i) determine whether or not the voltage output by the capacitor exceeds a certain threshold value; (ii) generate a second current having a magnitude according to information related to the temperature of the power semiconductor which drives a load; and (iii) change a magnitude of the first current based on the second current.

11 Claims, 5 Drawing Sheets

PROTECTION DEVICE, LOAD DRIVE SYSTEM, PROTECTION METHOD, AND RECORDING MEDIUM

CROSS-REFERENCE TO RELATED APPLICATION

Priority is claimed from Japanese Patent Application No. 2021-082626, filed on May 14, 2021, the content of which is incorporated herein by reference.

BACKGROUND OF THE INVENTION

Field of the Invention

The present disclosure relates to a protection device, a load drive system, a protection method, and a recording medium.

Description of Related Art

In a load drive system that drives a load by using a power semiconductor, in a case where the power semiconductor is short-circuited, a large current exceeding an allowable value may flow. Therefore, some load drive systems are provided with a protection device that prevents a large current from flowing to the load drive system in a case where a short circuit of a power semiconductor is detected.

As a related technology, Japanese Unexamined Patent Application, First Publication No. 2018-198460 discloses a technology related to a protection device in a load drive system, which protects the load drive system at an appropriate timing according to the temperature of a power semiconductor, by changing a threshold value for determining an overcurrent depending on the temperature of the power semiconductor.

SUMMARY OF THE INVENTION

Meanwhile, the short-circuit tolerance of the power semiconductor decreases as the junction temperature becomes higher. Therefore, in the load drive system, in a case where the junction temperature of the power semiconductor is high, it is necessary to perform a protection operation in a shorter amount of time than a case where the junction temperature is low. Therefore, there is a demand for a technology (different from Japanese Unexamined Patent Application, First Publication No. 2018-198460) capable of protecting the load drive system at an appropriate timing according to the temperature of the power semiconductor.

An object of the present disclosure is to provide a protection device, a load drive system, a protection method, and a recording medium capable of solving the problems described above.

According to an aspect of the present disclosure, there is provided a protection device including: a capacitor that outputs a voltage according to a charge accumulated by a first current; and a protection circuit that determines whether or not the voltage output by the capacitor exceeds a certain threshold value, generates a second current having a magnitude according to information related to the temperature of a power semiconductor which drives a load, and changes the magnitude of the first current based on the generated second current.

According to another aspect of the present disclosure, there is provided a load drive system including: the protection device described above; and a drive device including the power semiconductor to be protected by the protection device.

According to still another aspect of the present disclosure, there is provided a protection method including: outputting a voltage according to a charge accumulated by a first current; and determining whether or not the output voltage exceeds a certain threshold value, generating a second current having a magnitude according to information related to the temperature of a power semiconductor which drives a load, and changing a magnitude of the first current based on the generated second current.

According to still another aspect of the present disclosure, there is provided a non-transitory computer-readable recording medium recording program causing a computer to execute a process including: outputting a voltage according to a charge accumulated by a first current; and determining whether or not the output voltage exceeds a certain threshold value, generating a second current having a magnitude according to information related to the temperature of a power semiconductor which drives a load, and changing a magnitude of the first current based on the generated second current.

With a protection device, a load drive system, a protection method, and a recording medium according to embodiments of the present disclosure, it is possible to protect a load drive system at an appropriate timing depending on the temperature of a power semiconductor.

DETAILED DESCRIPTION OF THE INVENTION

Embodiment

Hereinafter, a load drive system according to embodiments of the present disclosure will be described.

(Configuration of Load Drive System)

Figure 1:
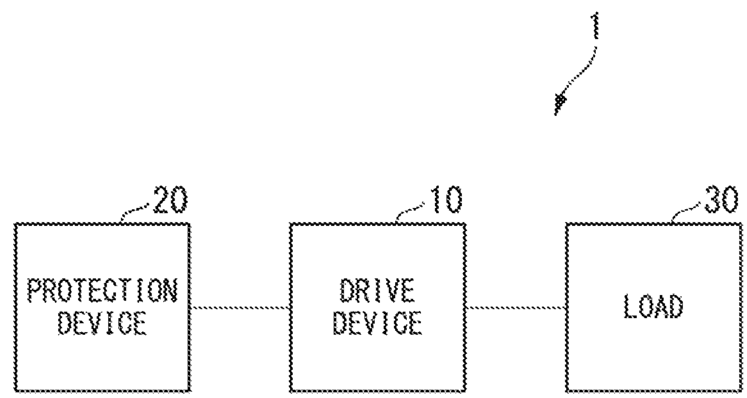
FIG. 1 is a diagram showing a first example of a configuration of a load drive system according to an embodiment of the present disclosure.
Figure 2:
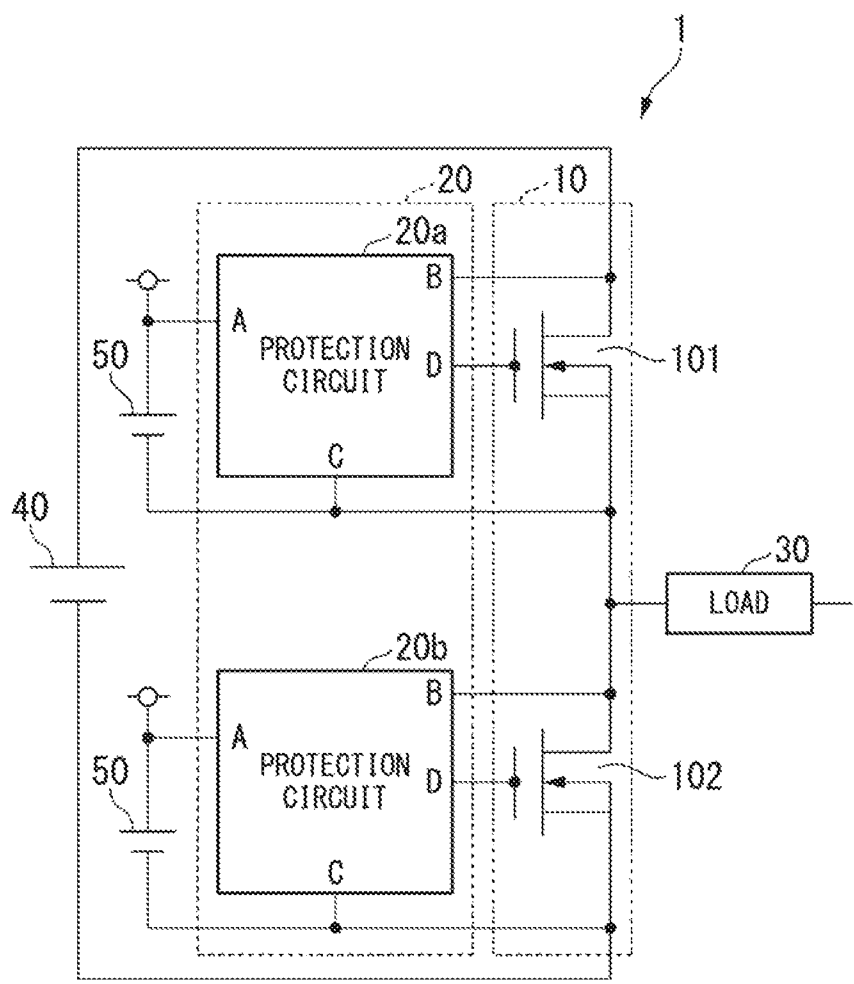
FIG. 2 is a diagram showing a second example of the configuration of the load drive system according to the embodiment of the present disclosure.

FIG. 1 is a diagram showing a first example of a configuration of a load drive system 1 according to an embodiment of the present disclosure. As shown in FIG. 1, the load drive system 1 includes a drive device 10 and a protection device 20. FIG. 1 shows a load 30 as a drive target of the drive device 10. FIG. 2 is a diagram showing a second example of the configuration of the load drive system 1 according to the embodiment of the present disclosure. The load drive system 1 shown in FIG. 2 is one of specific examples of the load drive system 1 shown in FIG. 1.

The drive device 10 is a device that drives the load 30 by a power semiconductor. As shown in FIG. 2, the drive device 10 includes, for example, N-channel metal oxide semiconductor (MOS) transistors (hereinafter, referred to as NMOSs) 101 and 102. The NMOSs 101 and 102 are power semiconductors. In a case where the NMOS 101 is in an on-state, the NMOS 102 is in an off-state, and a current flows from the NMOS 101 toward the load 30. Further, in a case where the NMOS 101 is in the off-state, the NMOS 102 is in the on-state, and a current is drawn from the load 30 toward the NMOS 102. Meanwhile, a dead time may be provided such that the NMOS 101 and the NMOS 102 are not in the on-state at the same time (that is, a through current does not flow). A power supply 40 is connected between a source of the NMOS 101 and a drain of the NMOS 102. The voltage output by the power supply 40 is, for example, several hundred volts.

The protection device 20 is a device that protects the load drive system 1 at a timing according to the temperature of the power semiconductor included in the drive device 10. As shown in FIG. 2, the protection device 20 includes protection circuits 20*a* and 20*b*. Each of the protection circuits 20*a* and 20*b* has terminals A, B, C, and D. In each of the protection circuits 20*a* and 20*b*, a power supply 50 is connected between the terminal C and the terminal A. The voltage output by the power supply 50 is, for example, several tens of volts. A specific example of terminals A, B, C, and D will be described below.

Figure 3:
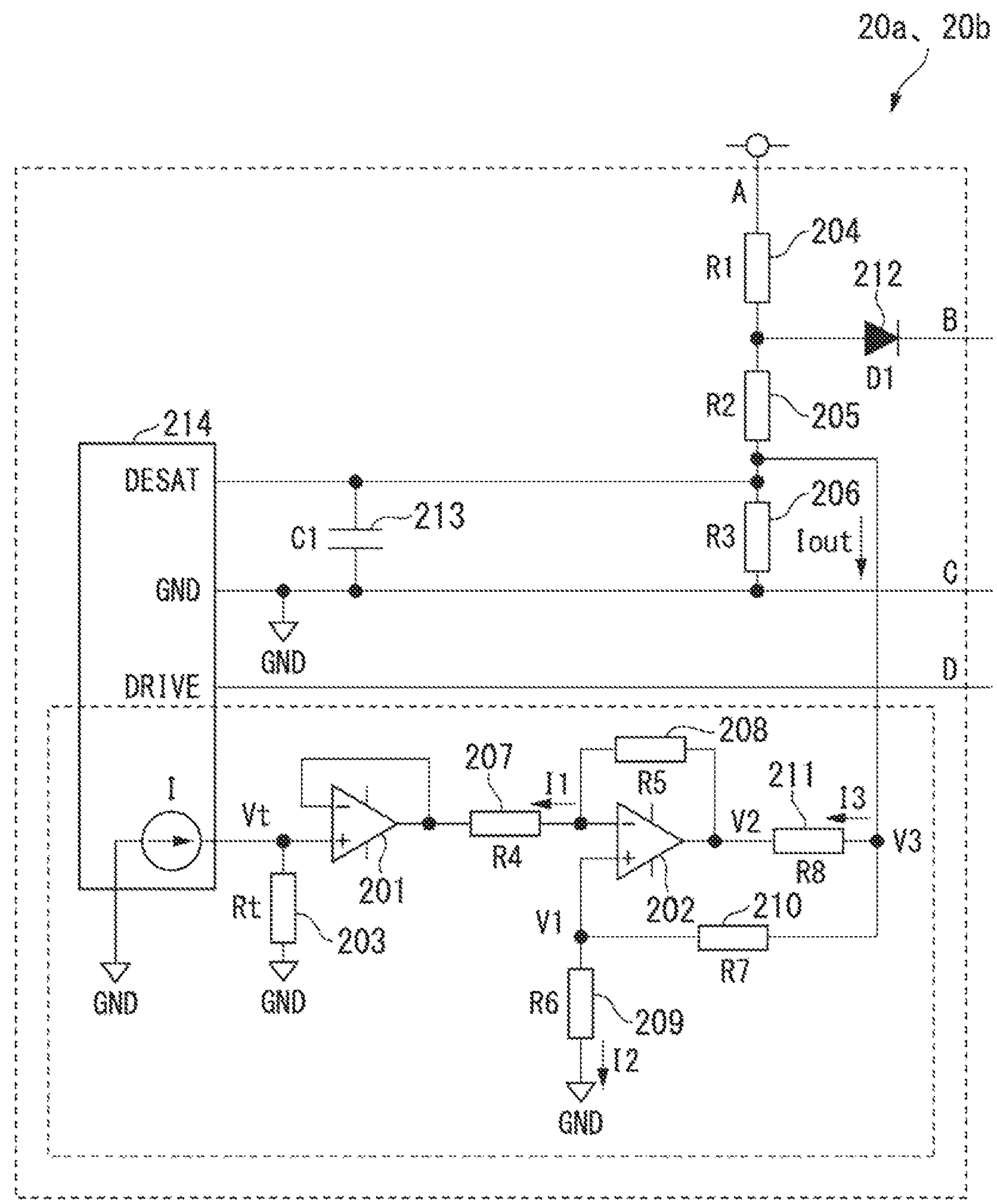
FIG. 3 is a diagram showing an example of a configuration of a protection circuit according to the embodiment of the present disclosure.

FIG. 3 is a diagram showing an example of a configuration of the protection circuits 20*a* and 20*b* according to the embodiment of the present disclosure. As shown in FIG. 3, each of the protection circuits 20*a* and 20*b* has operational amplifiers (hereinafter, referred to as op-amplifiers) 201 and 202, a thermistor 203 (an example of a voltage generation circuit), resistors 204, 205, 206, 207, 208, 209, 210, and 211, a diode 212, a capacitor 213, and a detection device 214.

A non-inverting input terminal of the op-amplifier 201 is connected to a first terminal of the thermistor 203 and a first terminal of the detection device 214. An inverting input terminal of the op-amplifier 201 is connected to an output terminal of the op-amplifier 201 and a first terminal of the resistor 207.

A non-inverting input terminal of the op-amplifier 202 is connected to a first terminal of the resistor 209 and a first terminal of the resistor 210. An inverting input terminal of the op-amplifier 202 is connected to a second terminal of the resistor 207 and a first terminal of the resistor 208. An output terminal of the op-amplifier 202 is connected to a second terminal of the resistor 208 and a first terminal of the resistor 211.

A second terminal of the thermistor 203 is connected to a ground terminal. A first terminal of the resistor 204 is connected to a power supply terminal. A second terminal of the resistor 204 is connected to a first terminal of the resistor 205 and an anode of the diode 212. A second terminal of the resistor 205 is connected to a first terminal of the resistor 206, a second terminal of the resistor 210, a second terminal of the resistor 211, a first terminal of the capacitor 213, and a second terminal of the detection device 214. A second terminal of the resistor 206, a second terminal of the resistor 209, a second terminal of the capacitor 213, a third terminal of the detection device 214, and a fourth terminal of the detection device 214 are connected to the ground terminal. The power supply terminal is a specific example of a terminal A of the protection circuits 20*a* and 20*b*. Further, a cathode of the diode 212 is a specific example of a terminal B of the protection circuits 20*a* and 20*b*. In addition, the ground terminal is a specific example of a terminal C of the protection circuits 20*a* and 20*b*. Further, a fifth terminal of the detection device 214 is a specific example of a terminal D of the protection circuits 20*a* and 20*b*.

Figure 4:
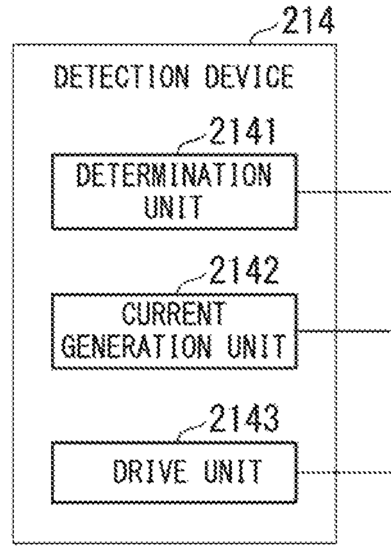
FIG. 4 is a diagram showing an example of a configuration of a detection device according to the embodiment of the present disclosure.

The detection device 214 is a device that detects a short circuit between the NMOSs 101 and 102 in the drive device 10. FIG. 4 is a diagram showing an example of a configuration of the detection device 214 according to the embodiment of the present disclosure. As shown in FIG. 4, the detection device 214 includes a determination unit 2141, a current generation unit 2142, and a drive unit 2143. The detection device 214 may be realized in an integrated circuit (IC).

The determination unit 2141 detects the voltage output by the capacitor 213 according to a charge accumulated by a current flowing through the capacitor 213 (an example of a first current). The determination unit 2141 determines whether or not the voltage output by the capacitor 213 exceeds a predetermined certain threshold value. In a case where it is determined that the voltage output by the capacitor 213 exceeds the threshold value, the determination unit 2141 determines that the power semiconductor is short-circuited. That is, the determination unit 2141 determines that the power semiconductor is short-circuited in a case where a potential at the second terminal of the detection device 214 exceeds the threshold value based on the ground terminal. In a case where the drive unit 2143 does not output an on-command to the power semiconductor, the second terminal of the detection device 214 is short-circuited to the ground terminal inside the detection device 214 such that the potential of the second terminal of the detection device 214 does not rise. A specific example of the short circuit of the power semiconductor will be described below.

The current generation unit 2142 (an example of a voltage generation circuit) generates a current, and passes the generated current through the thermistor 203. As a result, the protection circuits 20*a* and 20*b* generate a current (an example of a second current) having a magnitude according to information related to the temperature of the NMOSs 101 and 102 (an example of a power semiconductor) included in the drive device 10 that drives the load 30. The protection circuits 20*a* and 20*b* change the magnitude of the current flowing through the capacitor 213 based on the generated current.

For example, the current generation unit 2142 passes a constant current I through the thermistor 203 provided in the vicinity of a power semiconductor of which the temperature is changed. As a result, the protection circuits 20*a* and 20*b* generate a voltage Vt having a temperature characteristic. A current Iout that is changed according to the voltage value of the voltage Vt is generated from the voltage Vt. This current Iout acts to prevent charging of the capacitor 213, as shown in FIG. 3. In general, a resistance value of the thermistor 203 is decreased as the temperature rises. Therefore, as will be described in detail below, as the power semiconductor has a high temperature (that is, as the thermistor 203 has a high temperature), the current Iout becomes smaller. That is, a current for charging the capacitor 213 is increased as the power semiconductor has the high temperature. As a result, the voltage applied to the capacitor 213 rises in a shorter amount of time in a case where the power semiconductor is at a high temperature than a case where the power semiconductor is at a low temperature. Since the threshold value used by the determination unit 2141 at a time of determination is a certain value, the determination unit 2141 can determine a short circuit earlier in a case where the power semiconductor has a high temperature than a case where the power semiconductor has a low temperature.

Here, with reference to FIG. 3, the current Iout is derived. A potential of the non-inverting input terminal of the op-amplifier 201 is Vt. Further, a potential of the non-inverting input terminal of the op-amplifier 202 is set to V1. In addition, a potential of the output terminal of the op-amplifier 202 is V2. Further, a potential of the second terminal of the detection device 214 is V3. In addition, each of resistance values of the resistors 204, 205, 206, 207, 208, 209, 210, and 211 is set to each of R1, R2, R3, R4, R5, R6, R7, and R8. Further, a resistance value of the thermistor 203 is Rt. In addition, a current flowing through the resistor 207 is I1. Further, a current flowing through the resistor 209 is I2. In addition, the current flowing through the resistor 211 is I3.

The potential V1 of the non-inverting input terminal of the op-amplifier 202 can be expressed by Equation (1).

$$V1 = \frac{R6}{R6 + R7} V3 \tag{1}$$

Since the potential of the non-inverting input terminal of the op-amplifier 202 is V1, a potential of the inverting input terminal of the op-amplifier 202 is V1 when a virtual ground for the op-amplifier 202 is considered. Therefore, Equation (2) holds, for the current I1.

$$I1 = \frac{(V1 - Vt)}{R4} \tag{2}$$

Since the current flowing through the resistor 207 is I1, the potential V2 can be expressed by Equation (3).

$$V2 = \frac{R5}{R4}(V1 - Vt) + V1 = \frac{R4 + R5}{R4} V1 - \frac{R5}{R4} Vt = \frac{R4 + R5}{R4} \frac{R6}{R6 + R7} V3 - \frac{R5}{R4} Vt \tag{3}$$

Further, the current I3 can be expressed by Equation (4).

$$I3 = \frac{V3 - V2}{R8} = \frac{1}{R8}\left(V3 - \frac{R4 + R5}{R4} \frac{R6}{R6 + R7} V3 + \frac{R5}{R4} Vt\right) = \frac{1}{R8}\left(\frac{R4 \cdot R7 - R5 \cdot R6}{R4 \cdot (R6 + R7)} V3 + \frac{R5}{R4} Vt\right) \tag{4}$$

Further, Equation (5) holds, for the current I2.

$$I2 = \frac{V3}{R6 + R7} \tag{5}$$

A sum of the current I2 and the current I3 is the current Iout. Therefore, the current Iout can be expressed by Equation (6).

$$Iout = I2 + I3 = \frac{V3}{R6 + R7} + \frac{1}{R8}\left(\frac{R4 \cdot R7 - R5 \cdot R6}{R4 \cdot (R6 + R7)} V3 + \frac{R5}{R4} Vt\right) = \frac{1}{R8}\left(\frac{R4 \cdot (R7 + R8) - R5 \cdot R6}{R4 \cdot (R6 + R7)} V3 + \frac{R5}{R4} Vt\right) \tag{6}$$

Here, if R4·(R7+R8)=R5 R6, Equation (7) holds.

$$Iout = \frac{R5}{R4 \cdot R8} Vt \tag{7}$$

Here, the voltage Vt in Equation (7) is obtained by multiplying the constant current I output by the current generation unit 2142 by the resistance value Rt of the thermistor 203 having a temperature characteristic. Therefore, a resistance value is adjusted such that R4 (R7+R8)=R5 R6 holds, and a ratio between R5 and R4 R8 and the voltage Vt (that is, the current generated by the current generation unit 2142) are adjusted, so that the protection circuits 20*a* and 20*b* can generate the current Iout of which a current value is decreased as the power semiconductor has a high temperature.

Figure 5:
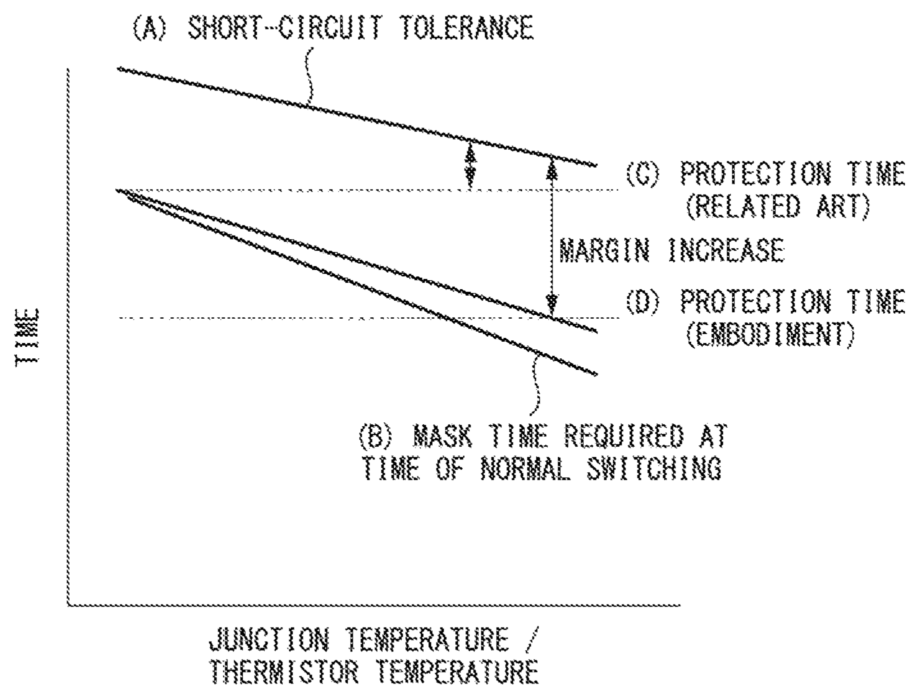
FIG. 5 is a diagram for describing an effect of a current Iout according to the embodiment of the present disclosure.

FIG. 5 is a diagram for describing an effect of the current Iout according to the embodiment of the present disclosure.

Next, the effect of the current Iout will be described with reference to FIG. 5. In FIG. 5, a horizontal axis indicates a junction temperature or thermistor temperature. A vertical axis indicates a time. A line (A) in FIG. 5 is a short-circuit tolerance, and indicates that a defect will occur in the power semiconductor if a protection operation is not executed by this time. Further, a line (B) in FIG. 5 shows a time required for switching of the power semiconductor. That is, in a case where the protection circuit operates at a timing when exceeding the line (A), a defect occurs in the power semiconductor. In a case where the protection circuit operates at a timing less than the line (B), it is erroneously determined that the power semiconductor is short-circuited since switching of the power semiconductor is not completed. Therefore, the timing when operating the protection circuit has to be a timing between the line (A) and the line (B). However, in a protection circuit that operates when a certain condition is satisfied regardless of the temperature without using the current Iout in the related art, in many cases, the protection circuit is set to operate on the line (C) at which a margin for a short-circuit tolerance and a time equal to or greater than a time required for switching at low temperature are secured, as shown in FIG. 5. In this case, a difference between the line (A) and the line (B) is large at a high temperature, so even in a status in which a margin for the short-circuit tolerance can be provided at the high temperature, the margin cannot be provided.

On the other hand, according to the embodiment of the present disclosure, by using the current Iout having a temperature characteristic, it is possible to adjust the timing of operating the protection circuit, as shown by a line (D) in FIG. 5. Therefore, it is possible to provide the margin for the short-circuit tolerance at the high temperature.

The drive unit 2143 drives the power semiconductor (that is, NMOS) of the drive device 10. For example, the drive unit 2143 outputs an on-command to a gate of an NMOS while the NMOS is in the on-state. Further, the drive unit

2143 does not output the on-command to the gate of the NMOS while the NMOS is in the off-state. That is, the drive unit 2143 outputs the on-command to the gate of the NMOS only while the NMOS is in the on-state.

(Operation of Protection Circuit)

Next, operations of the protection circuits 20a and 20b according to the embodiment of the present disclosure will be described with reference to FIGS. 2 and 3. The protection circuits 20a and 20b according to the embodiment of the present disclosure are circuits that generate the voltage Vt having a temperature characteristic by passing the current I generated by the current generation unit 2142 to the thermistor 203, and are circuits that change a charging time by generating the current Iout (current of a magnitude according to information related to the temperature) that is changed according to the value of the voltage Vt and by changing the current for charging the capacitor 213 according to the temperature change of a power semiconductor.

It is assumed that the voltage output by the power supply 40 is, for example, several hundred volts. Further, it is assumed that the voltage output by the power supply 50 is, for example, several tens of volts. That is, the voltage output by the power supply 40 is sufficiently larger than the voltage output by the power supply 50.

First, operations of the protection circuits 20a and 20b in a case where both the NMOSs 101 and 102 which are power semiconductors are not short-circuited will be described. In a case where the NMOSs 101 and 102 shown in FIG. 2 are not short-circuited, each of the NMOSs 101 and 102 is in the on-state in a case where an on-command is received. In that case, a voltage applied between a source and drain of the NMOS (NMOS 101 or NMOS 102) in the on-state is a voltage sufficiently lower (for example, 1 volt) than the voltage output by the power supply 50. Therefore, the diode 212 shown in FIG. 3 has a forward bias, and allows a flow of a current. In this case, a current flows from the power supply 50 to the NMOS (NMOS 101 or NMOS 102) in the on-state via the diode 212. As a result, in a case where the diode 212 is in the on-state, the voltage between the anode of the diode 212 and the ground terminal (terminal C) is the sum of the voltage between the source and drain in a linear region of a static characteristic of the NMOS (NMOS 101 or NMOS 102) and a forward voltage of the diode 212. The static characteristic in this case is a characteristic showing a relationship between a drain current and the voltage between the source and drain. Therefore, the current flowing through the resistors 205 and 206, and the capacitor 213 is smaller than that in the case where the diode 212 is in the off-state, and the potential at the second terminal of the detection device 214 remains low. As a result, the determination unit 2141 determines that the voltage output by the capacitor 213 does not exceed a threshold value, that is, the power semiconductor is not short-circuited.

Next, an operation of the protection circuit 20a in a case where a power semiconductor is short-circuited will be described. Here, the operation of the protection circuit 20a in a case where the NMOS 102 is short-circuited will be described with reference to FIGS. 2 and 3. In a case where the NMOS 102 shown in FIG. 2 is short-circuited, a potential of a ground terminal of the protection circuit 20a drops to the potential of a ground terminal of the protection circuit 20b. As a result, the voltage output by the power supply 40 is applied between the source and drain of the NMOS 101. Therefore, the diode 212 included in the protection circuit 20a has a reverse bias, and does not allow a flow of a current. As a result, a current flows through the resistors 205 and 206 and the capacitor 213. As described above, the current flowing at this time is a current having a temperature characteristic by the current Iout, and the current is increased as the power semiconductor has a high temperature. As a result, the voltage output by the capacitor 213 exceeds a threshold value at an early stage as the temperature rises, so that the determination unit 2141 can detect a short circuit of the power semiconductor at an appropriate timing according to the temperature of the power semiconductor. The drive unit 2143 controls the NMOS (for example, stops the output of the on-command) according to a timing when the determination unit 2141 detects a short circuit of the power semiconductor, so that it is possible to actually operate the protection circuit 20a, and it is possible to protect the load drive system 1. An operation of the protection circuit 20b in a case where the NMOS 101 is short-circuited can be considered in the same manner, in consideration of a circuit symmetry.

Action and Effect

Hereinbefore, the load drive system 1 according to the embodiment of the present disclosure is described. In the protection device 20 of the load drive system 1, the capacitor 213 outputs a voltage according to a charge accumulated by a first current. Further, the protection circuits 20a and 20b determine whether or not a voltage output by the capacitor 213 exceeds a certain threshold value. The protection circuits 20a and 20b generate a second current (Iout) having a magnitude according to information related to the temperature of the power semiconductor (NMOSs 101 and 102) that drives the load 30, and change the magnitude of the first current, based on the generated second current. In this manner, the protection device 20 can protect the load drive system 1 at an appropriate timing according to the temperature of the power semiconductor (NMOSs 101 and 102).

In the embodiment of the present disclosure, the control of switching of the NMOSs 101 and 102 (that is, control of the voltage applied to the gates of the NMOSs 101 and 102) is described as being performed by the protection device 20. However, according to another embodiment of the present disclosure, the switching control of the NMOSs 101 and 102 may be performed by a control device (not shown).

Figure 6:
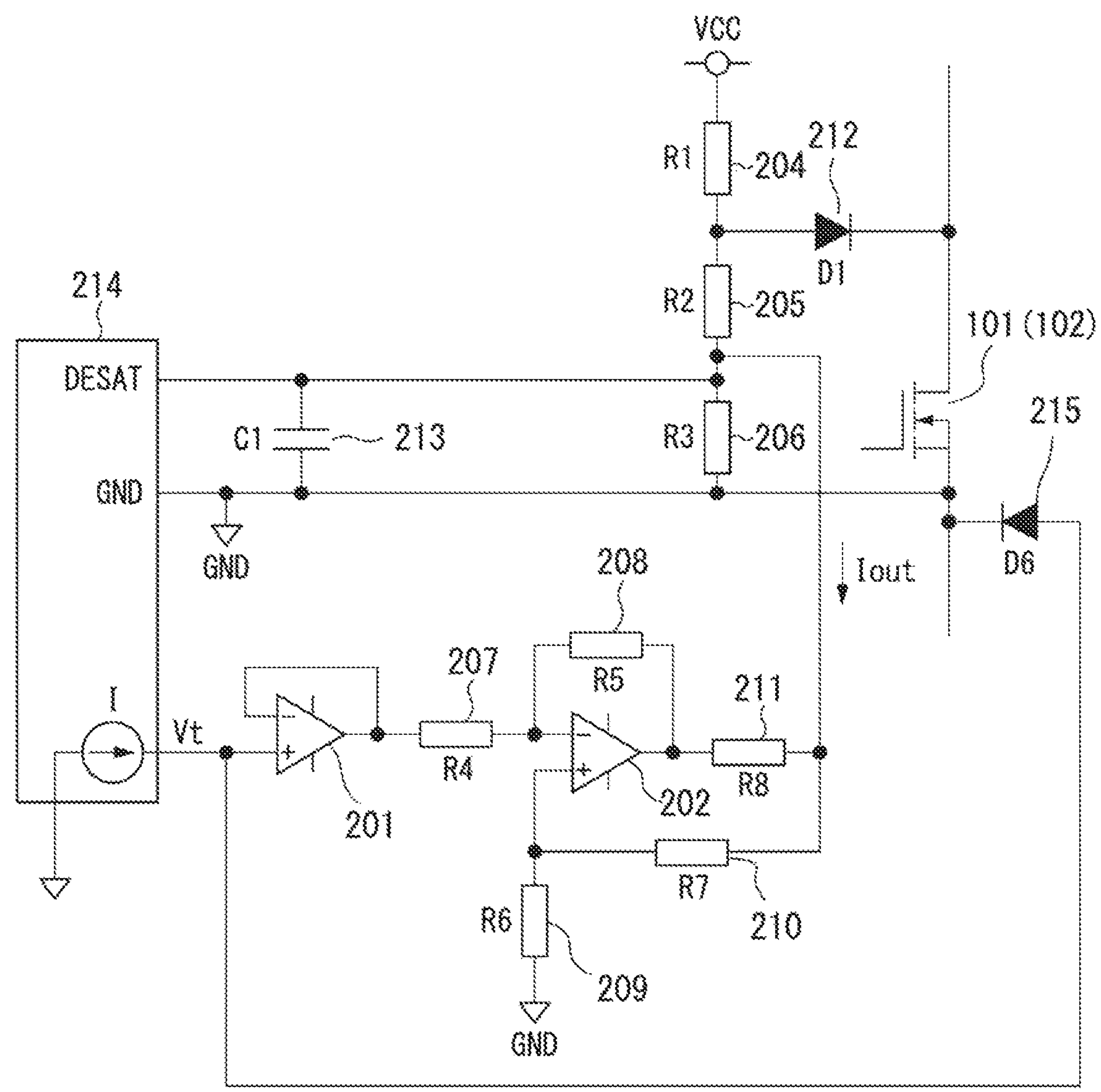
FIG. 6 is a diagram showing an example of a configuration of a protection circuit according to another embodiment of the present disclosure.
Figure 7:
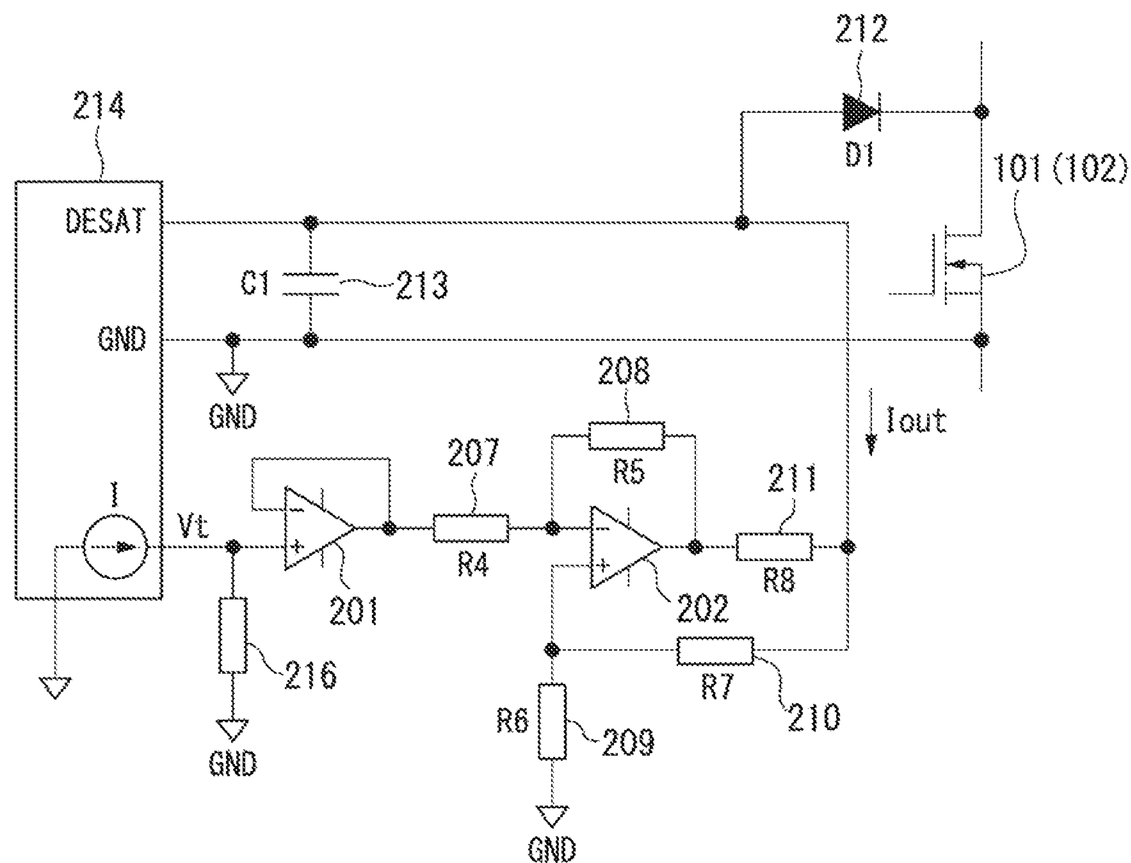
FIG. 7 is a diagram showing an example of a configuration of a protection device according to still another embodiment of the present disclosure.

In the embodiment of the present disclosure, the case where the load drive system 1 sets the temperature characteristic to the current Iout by using the temperature characteristic of the thermistor 203 is described. However, according to still another embodiment of the present disclosure, the current Iout may have a temperature characteristic by using a temperature characteristic other than the thermistor 203. For example, the current Iout may have a temperature characteristic by using a temperature characteristic of a diode provided in the vicinity of the power semiconductor. Specifically, as shown in FIG. 6, by passing the constant current I generated by the current generation unit 2142 through a diode 215, the voltage Vt may have the temperature characteristic, and as a result, the current Iout may have the temperature characteristic. Further, for example, temperature detection means using a temperature characteristic of a PN junction is provided in the vicinity of the power semiconductor, and a digital value of the voltage according to the temperature is generated by AD conversion of the voltage according to the detected temperature. As shown in FIG. 7, by using this digital value, the current generation unit 2142 may generate a current having a temperature characteristic and passes the generated current through the resistor 216 to give the voltage Vt the temperature characteristic or to directly give the first current the temperature characteristic.

According to still another embodiment of the present disclosure, the protection device 20 may supply a current from the second terminal of the detection device 214 to the power semiconductor via the diode 212 without using a resistor, as shown in FIG. 7, for example. The current to be supplied to the power semiconductor may be provided with a temperature characteristic by using the current Iout. Even in a case where the protection device 20 supplies the current from the second terminal of the detection device 214 to the power semiconductor via the diode 212 without using the resistor, a method of giving the current Iout a temperature characteristic is not limited to the method in which the current generation unit 2142 generates the current having the temperature characteristic and passes the generated current through the resistor 216, and any method described above may be used.

In the processes according to the embodiment of the present disclosure, an order of the process may be changed as long as an appropriate process is performed.

Each of the storage unit and the other storage devices in the embodiment of the present disclosure may be provided anywhere as long as appropriate information is transmitted and received. Further, each of the storage unit and the other storage devices may exist at a plurality of locations within a range in which appropriate information is transmitted and received, and data may be distributed and stored.

Although the embodiment of the present disclosure is described, the protection device 20, the detection device 214, and the other control devices described above may have a computer system inside. The step of the process described above is stored in a computer-readable recording medium in a form of a program, and the process described above is performed by the computer reading and executing this program. A specific example of the computer will be described below.

The program may be stored in a storage device such as a hard disk drive (HDD) or a flash memory in advance or may be stored in a detachable storage medium such as a DVD or a CD-ROM and then installed on the storage device by inserting the storage medium into a drive device.

Figure 8:
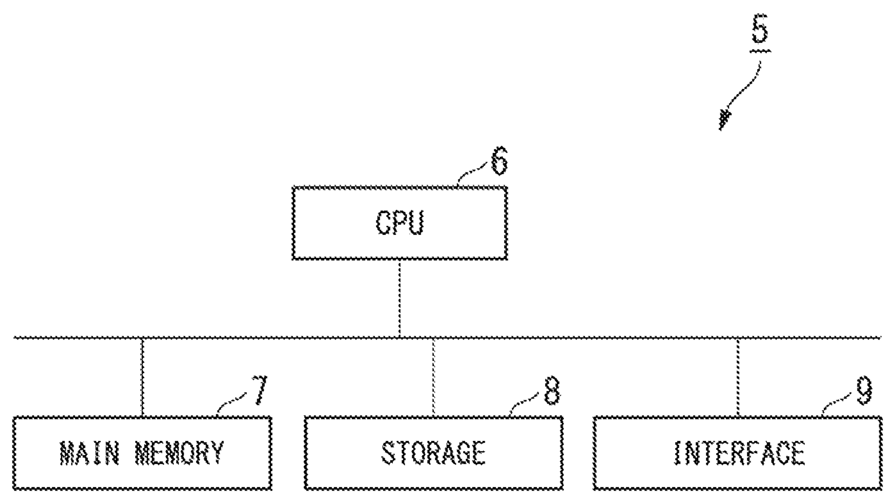
FIG. 8 is a schematic block diagram showing the configuration of a computer according to at least one embodiment.

FIG. 8 is a schematic block diagram showing a configuration of a computer according to at least one embodiment.

As shown in FIG. 8, a computer 5 includes a CPU 6, a main memory 7, a storage 8, and an interface 9.

For example, each of the protection device 20, the detection device 214, and other control devices described above is mounted on the computer 5. The operation of each processing unit described above is stored in the storage 8 in a form of a program. The CPU 6 reads a program from the storage 8, expands the program into the main memory 7, and executes the above process according to the program. Further, the CPU 6 ensures a storage region corresponding to each storage unit described above in the main memory 7, according to the program.

A hard disk drive (HDD), a solid state drive (SSD), a magnetic disk, a magneto-optical disk, a compact disc read only memory (CD-ROM), a digital versatile disc read only memory (DVD-ROM), a semiconductor memory, and the like are exemplary examples of the storage 8. The storage 8 may be an internal medium directly connected to a bus of the computer 5 or an external medium connected to the computer 5 via the interface 9 or a communication line. Further, in a case where this program is distributed to the computer 5 via the communication line, the computer 5 which receives the distribution may expand the program into the main memory 7 to execute the above process. In at least one embodiment, the storage 8 is a non-transitory storage medium.

In addition, the program described above may realize a part of the function described above. Further, the program may be a file that can realize the function described above in combination with a program already recorded in the computer system, that is, a so-called difference file (difference program).

In still another embodiment, each of the protection device 20, the detection device 214, and the other control devices may include a custom large scale integrated circuit (LSI) such as a programmable logic device (PLD), an application specific integrated circuit (ASIC), a graphics processing unit (GPU), and a processing device similar thereto. A programmable array logic (PAL), a generic array logic (GAL), and a complex programmable logic device (CPLD), and a field programmable gate array (FPGA) are exemplary examples of the PLD. In this case, a part or the entirety of a function realized by a processor may be realized by the integrated circuit.

Although some embodiments of the present disclosure are described, these embodiments are examples and do not limit the scope of the disclosure. Various additions, omissions, replacements, and changes may be made to these embodiments without departing from the gist of the disclosure.

APPENDIX

The protection device 20, the load drive system 1, the protection method, and the recording medium described in each embodiment of the present disclosure are grasped as follows, for example.

(1) According to a first aspect, there is provided a protection device (20) including a capacitor (213) that outputs a voltage according to a charge accumulated by a first current, and a protection circuit (20*a* and 20*b*) that determines whether or not the voltage output by the capacitor (213) exceeds a certain threshold value, generates a second current (Iout) having a magnitude according to information related to a temperature of a power semiconductor (101 and 102) which drives a load (30), and changes a magnitude of the first current, based on the generated second current (Iout).

With this protection device (20), a short circuit of the power semiconductor (101 and 102) can be detected at a timing according to the temperature of the power semiconductor (101 and 102). As a result, the protection device (20) can protect a load drive system (1) at an appropriate timing according to the temperature of the power semiconductor (101 and 102).

(2) According to the protection device (20) of appendix (1), in the protection device (20) according to a second aspect, the protection circuit (20*a* and 20*b*) may output an on-command in a case where the power semiconductor (101 and 102) is in an on-state, and stop the output of the on-command in a case where it is determined that the voltage output by the capacitor (213) exceeds the threshold value.

With this protection device (20), a short circuit of the power semiconductor (101 and 102) can be detected at a timing according to the temperature of the power semiconductor (101 and 102). As a result, the protection device (20) can protect a load drive system (1) at an appropriate timing according to the temperature of the power semiconductor (101 and 102).

(3) According to the protection device (20) of appendix (1) or (2), in the protection device (20) according to a third aspect, the protection circuit (20*a* and 20*b*) may include a current generation circuit that generates the second current, and the current generation circuit may include a voltage generation circuit (203, 215, 216, and 2142) that generates a voltage of which a value is changed according to the temperature of the power semiconductor (101 and 102), a first operational amplifier (201), a second operational amplifier (202), a first resistor (207), a second resistor (208), a third resistor (209), a fourth resistor (210), and a fifth resistor (211), and a non-inverting input terminal of the first operational amplifier (201) may be connected to the voltage generation circuit (203, 215, 216, and 2142), an inverting input terminal of the first operational amplifier (201) may be connected to an output terminal of the first operational amplifier (201) and a first terminal of the first resistor (207), a non-inverting input terminal of the second operational amplifier (202) may be connected to a first terminal of the third resistor (209) and a first terminal of the fourth resistor (210), an inverting input terminal of the second operational amplifier (202) may be connected to a second terminal of the first resistor (207) and a first terminal of the second resistor (208), an output terminal of the second operational amplifier (202) may be connected to a second terminal of the second resistor (208) and a first terminal of the fifth resistor (211), a second terminal of the fourth resistor (210) may be connected to a second terminal of the fifth resistor (211) and the capacitor (213), and a second terminal of the third resistor (209) may be connected to a ground terminal.

With this protection device (20), a short circuit of the power semiconductor (101 and 102) can be detected at a timing according to the temperature of the power semiconductor (101 and 102). As a result, the protection device (20) can protect a load drive system (1) at an appropriate timing according to the temperature of the power semiconductor (101 and 102).

(4) According to the protection device (20) of appendix (3), in the protection device (20) according to a fourth aspect, the voltage generation circuit (203 and 2142) may include a thermistor (203) provided in a vicinity of the power semiconductor (101 and 102) and a constant current source (2142), and apply a voltage generated in the thermistor (203) to the non-inverting input terminal of the first operational amplifier (201) in a case w % here a current generated by the constant current source (2142) flows through the thermistor (203).

With this protection device (20), the second current according to the temperature characteristic of the thermistor (203) can be generated, and a short circuit of the power semiconductor (101 and 102) can be detected at a timing according to the temperature of the power semiconductor (101 and 102). As a result, the protection device (20) can protect a load drive system (1) at an appropriate timing according to the temperature of the power semiconductor (101 and 102).

(5) According to the protection device (20) of appendix (3), in the protection device (20) according to a fifth aspect, the voltage generation circuit (215 and 2142) may include a diode (215) provided in a vicinity of the power semiconductor (101 and 102) and a constant current source (2142), and apply a voltage generated in the diode (215) to the non-inverting input terminal of the first operational amplifier (201) in a case where a current generated by the constant current source (2142) flows through the diode (215).

With this protection device (20), the second current according to the temperature characteristic of a PN junction of the diode (215) can be generated, and a short circuit of the power semiconductor (101 and 102) can be detected at a timing according to the temperature of the power semiconductor (101 and 102). As a result, the protection device (20) can protect a load drive system (1) at an appropriate timing according to the temperature of the power semiconductor (101 and 102).

(6) According to the protection device (20) of appendix (3), in the protection device (20) according to a sixth aspect, the voltage generation circuit (216 and 2142) may include a current source (2142) that generates a current according to the temperature change of the power semiconductor (101 and 102) and a sixth resistor (216), and apply a voltage generated in the sixth resistor (216) to the non-inverting input terminal of the first operational amplifier (201) in a case where the current generated by the current source (2142) flows through the sixth resistor (216).

With this protection device (20), the second current can be generated by passing the current according to the temperature through the resistor (216), and a short circuit of the power semiconductor (101 and 102) can be detected at a timing according to the temperature of the power semiconductor (101 and 102). As a result, the protection device (20) can protect a load drive system (1) at an appropriate timing according to the temperature of the power semiconductor (101 and 102).

(7) According to a seventh aspect, there is provided a load drive system (1) including: the protection device (20) according to any one of appendices (1) to (6); and a drive device (10) including the power semiconductor (101 and 102) to be protected by the protection device (20).

With this load drive system (1), a short circuit of the power semiconductor (101 and 102) can be detected at a timing according to the temperature of the power semiconductor (101 and 102). As a result, the load drive system (1) can protect the load drive system (1) at an appropriate timing according to the temperature of the power semiconductor (101 and 102).

(8) According to an eighth aspect, there is provided a protection method including: outputting a voltage according to a charge accumulated by a first current; and determining whether or not the output voltage exceeds a certain threshold value, generating a second current (Iout) having a magnitude according to information related to the temperature of a power semiconductor (101 and 102) which drives a load (30), and changing a magnitude of the first current based on the generated second current (Iout).

With this protection method, a short circuit of the power semiconductor (101 and 102) can be detected at a timing according to the temperature of the power semiconductor (101 and 102). As a result, the protection method can protect a load drive system (1) at an appropriate timing according to the temperature of the power semiconductor (101 and 102).

(9) According to a ninth aspect, there is provided a non-transitory computer-readable recording medium recording program causing a computer to execute a process including: outputting a voltage according to a charge accumulated by a first current; and determining whether or not the output voltage exceeds a certain threshold value, generating a second current (Iout) having a magnitude according to information related to the temperature of a power semiconductor (101 and 102) which drives a load (30), and changing the magnitude of the first current based on the generated second current (Iout).

With this recording medium, a short circuit of the power semiconductor (101 and 102) can be detected at a timing according to the temperature of the power semiconductor (101 and 102). As a result, the recording medium can protect a load drive system (1) at an appropriate timing according to the temperature of the power semiconductor (101 and 102).

While preferred embodiments of the invention have been described and illustrated above, it should be understood that these are exemplary examples of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:

1. A protection device comprising:

a capacitor configured to output a voltage according to a charge accumulated by a first current; and a protection circuit configured to: (i) determine whether or not the voltage output by the capacitor exceeds a certain threshold value; (ii) generate a second current having a magnitude according to information related to a temperature of a power semiconductor which drives a load; and (iii) increase the first current as the second current becomes smaller.

2. The protection device according to claim 1, wherein the protection circuit is further configured to: (i) output an on-command in a case where the power semiconductor is in an on-state; and (ii) stop the output of the on-command in a case where the voltage output by the capacitor exceeds the threshold value.

3. The protection device according to claim 1, wherein:

the protection circuit includes a current generation circuit configured to generate the second current;

the current generation circuit includes a voltage generation circuit configured to generate a voltage of which a value is configured to be changed according to the temperature of the power semiconductor, a first operational amplifier, a second operational amplifier, a first resistor, a second resistor, a third resistor, a fourth resistor, and a fifth resistor; and a non-inverting input terminal of the first operational amplifier is connected to the voltage generation circuit, an inverting input terminal of the first operational amplifier is connected to an output terminal of the first operational amplifier and a first terminal of the first resistor, a non-inverting input terminal of the second operational amplifier is connected to a first terminal of the third resistor and a first terminal of the fourth resistor, an inverting input terminal of the second operational amplifier is connected to a second terminal of the first resistor and a first terminal of the second resistor, an output terminal of the second operational amplifier is connected to a second terminal of the second resistor and a first terminal of the fifth resistor, a second terminal of the fourth resistor is connected to a second terminal of the fifth resistor and the capacitor, and a second terminal of the third resistor is connected to a ground terminal.

4. The protection device according to claim 3, wherein the voltage generation circuit includes a thermistor and a constant current source, and is configured to apply a voltage generated in the thermistor to the non-inverting input terminal of the first operational amplifier in a case where a current generated by the constant current source flows through the thermistor.

5. The protection device according to claim 3, wherein the voltage generation circuit includes a diode and a constant current source, and is configured to apply a voltage generated in the diode to the non-inverting input terminal of the first operational amplifier in a case where a current generated by the constant current source flows through the diode.

6. The protection device according to claim 3, wherein the voltage generation circuit includes a current source configured to: (i) generate a current according to a temperature change of the power semiconductor and a sixth resistor; and (ii) apply a voltage generated in the sixth resistor to the non-inverting input terminal of the first operational amplifier in a case where the current generated by the current source flows through the sixth resistor.

7. A load drive system comprising:

the protection device according to claim 1; and a drive device including the power semiconductor which is to be protected by the protection device.

8. A protection method comprising:

outputting a voltage according to a charge accumulated by a first current; and determining whether or not the voltage exceeds a certain threshold value, generating a second current having a magnitude according to information related to a temperature of a power semiconductor which drives a load, and increasing the first current as the second current becomes smaller.

9. A non-transitory computer-readable recording medium recording program for causing a computer to execute a process comprising:

outputting a voltage according to a charge accumulated by a first current; and determining whether or not the voltage exceeds a certain threshold value, generating a second current having a magnitude according to information related to a temperature of a power semiconductor which drives a load, and increasing the first current as the second current becomes smaller.

10. The protection method according to claim 8, further comprising:

connecting a non-inverting input terminal of a first operational amplifier of a current generation circuit to a voltage generation circuit that generates a voltage of which a value is changed according to the temperature of the power semiconductor;

connecting an inverting input terminal of the first operational amplifier to an output terminal of the first operational amplifier and a first terminal of a first resistor;

connecting a non-inverting input terminal of a second operational amplifier to a first terminal of a third resistor and a first terminal of a fourth resistor;

connecting an inverting input terminal of the second operational amplifier to a second terminal of the first resistor and a first terminal of a second resistor;

connecting an output terminal of the second operational amplifier to a second terminal of the second resistor and a first terminal of a fifth resistor;

connecting a second terminal of the fourth resistor to a second terminal of the fifth resistor and a capacitor; and connecting a second terminal of the third resistor to a ground terminal.

11. The non-transitory computer-readable recording medium according to claim 9, wherein the process further comprises:

connecting a non-inverting input terminal of a first operational amplifier of a current generation circuit to a voltage generation circuit that generates a voltage of which a value is changed according to the temperature of the power semiconductor;

connecting an inverting input terminal of the first operational amplifier to an output terminal of the first operational amplifier and a first terminal of a first resistor;

connecting a non-inverting input terminal of a second operational amplifier to a first terminal of a third resistor and a first terminal of a fourth resistor;

connecting an inverting input terminal of the second operational amplifier to a second terminal of the first resistor and a first terminal of a second resistor;

connecting an output terminal of the second operational amplifier to a second terminal of the second resistor and a first terminal of a fifth resistor;

connecting a second terminal of the fourth resistor to a second terminal of the fifth resistor and a capacitor; and connecting a second terminal of the third resistor to a ground terminal.

* * * * *